(12) United States Patent
Sakuma et al.

(10) Patent No.: US 12,374,414 B2
(45) Date of Patent: Jul. 29, 2025

(54) SEMICONDUCTOR DEVICE, LIQUID DISCHARGE HEAD, AND LIQUID DISCHARGE APPARATUS

(71) Applicant: CANON KABUSHIKI KAISHA, Tokyo (JP)

(72) Inventors: Sadayoshi Sakuma, Kanagawa (JP); Toshio Negishi, Kanagawa (JP); Yasuhiro Soeda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 519 days.

(21) Appl. No.: 17/687,482

(22) Filed: Mar. 4, 2022

(65) Prior Publication Data

US 2022/0293201 A1  Sep. 15, 2022

(30) Foreign Application Priority Data

Mar. 11, 2021  (JP) ................. 2021-039535

(51) Int. Cl.
*B41J 2/04* (2006.01)
*B41J 2/045* (2006.01)
*G11C 17/16* (2006.01)
*G11C 17/18* (2006.01)
*H10B 20/25* (2023.01)

(52) U.S. Cl.
CPC ......... *G11C 17/165* (2013.01); *B41J 2/04511* (2013.01); *B41J 2/04541* (2013.01); *B41J 2/0455* (2013.01); *G11C 17/18* (2013.01); *H10B 20/25* (2023.02)

(58) Field of Classification Search
CPC .. B41J 2/04511; B41J 2/04541; B41J 2/0455; B41J 2/01; B41J 2/04543; B41J 2/0458; B41J 2/135; G11C 17/165; G11C 17/18; G11C 17/16; H10B 20/25; H01L 27/0266
See application file for complete search history.

(56) References Cited

FOREIGN PATENT DOCUMENTS

| CN | 1779851 A | 5/2006 |
|---|---|---|
| CN | 107618263 A | 1/2018 |
| CN | 107799153 A | 3/2018 |
| CN | 108695330 A | 10/2018 |
| CN | 110267817 A | 9/2019 |
| JP | 2009071261 A | 4/2009 |
| JP | 2014-058130 A | 4/2014 |
| JP | 2017188606 | * 10/2017 |
| JP | 2017188606 A | 10/2017 |
| JP | 2018134809 A | 8/2018 |

* cited by examiner

*Primary Examiner* — Kristal Feggins
(74) *Attorney, Agent, or Firm* — Canon U.S.A., Inc. IP Division

(57) ABSTRACT

A device, comprising a plurality of units arrayed in a predetermined direction, a first terminal configured to supply a voltage to the plurality of units, and a second terminal configured to supply a voltage to the plurality of units, wherein the plurality of units include a first unit including a memory element arranged between the first terminal and the second terminal, and a first transistor configured to perform write to the memory element, and a second unit including a second transistor arranged between the first terminal and the second terminal in correspondence with the first transistor of the first unit.

20 Claims, 5 Drawing Sheets

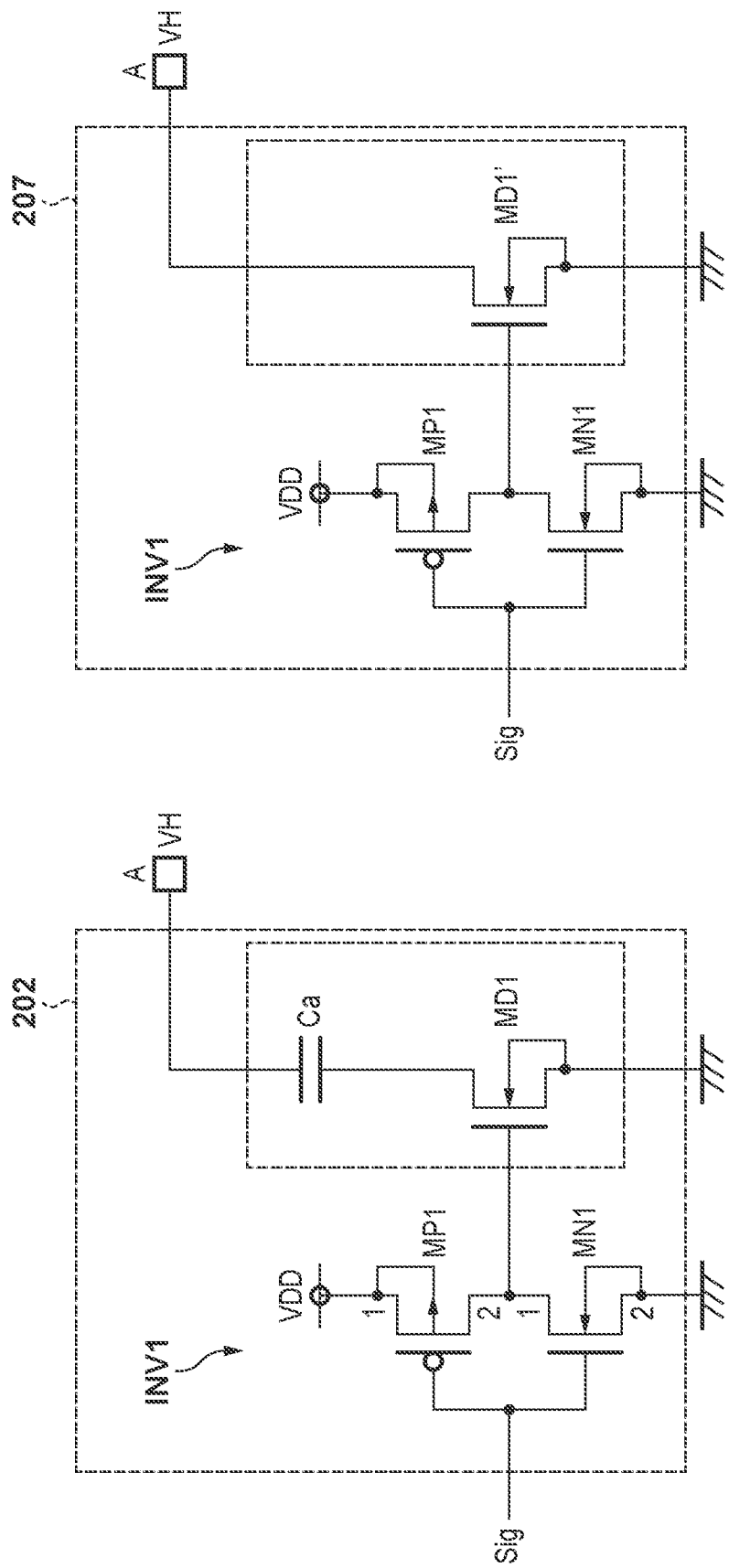

SEMICONDUCTOR DEVICE, LIQUID DISCHARGE HEAD, AND LIQUID DISCHARGE APPARATUS

BACKGROUND

Field of the Disclosure

The aspect of the embodiments relates to a semiconductor device.

Description of the Related Art

Some semiconductor devices include a memory configured to permit write only once, that is, a so-called OTP (One Time Programmable) memory as a memory element for storing specific information of a device after completion of manufacturing. As the OTP memory, an anti-fuse element can typically be used (see Japanese Patent Laid-Open No. 2014-58130).

In the above-described semiconductor devices, as one means for appropriately implementing information write to a memory element or information read from the memory element, a configuration capable of evaluating a circuit configuration around the memory element, particularly, a parasitic component in the circuit may be demanded.

SUMMARY OF THE DISCLOSURE

One of the aspects of the embodiments provides a semiconductor device, comprising a plurality of units arrayed in a predetermined direction, a first terminal configured to supply a voltage to the plurality of units, and a second terminal configured to supply a voltage to the plurality of units, wherein the plurality of units include a first unit including a memory element arranged between the first terminal and the second terminal, and a first transistor configured to perform write to the memory element, and a second unit including a second transistor arranged between the first terminal and the second terminal in correspondence with the first transistor of the first unit.

Further features of the disclosure will become apparent from the following description of exemplary embodiments (with reference to the attached drawings).

BRIEF DESCRIPTION OF THE DRAWINGS

FIGS. 2A and 2B are circuit diagrams for explaining an example of the configuration of the print element substrate;

DESCRIPTION OF THE EMBODIMENTS

Figure 1:
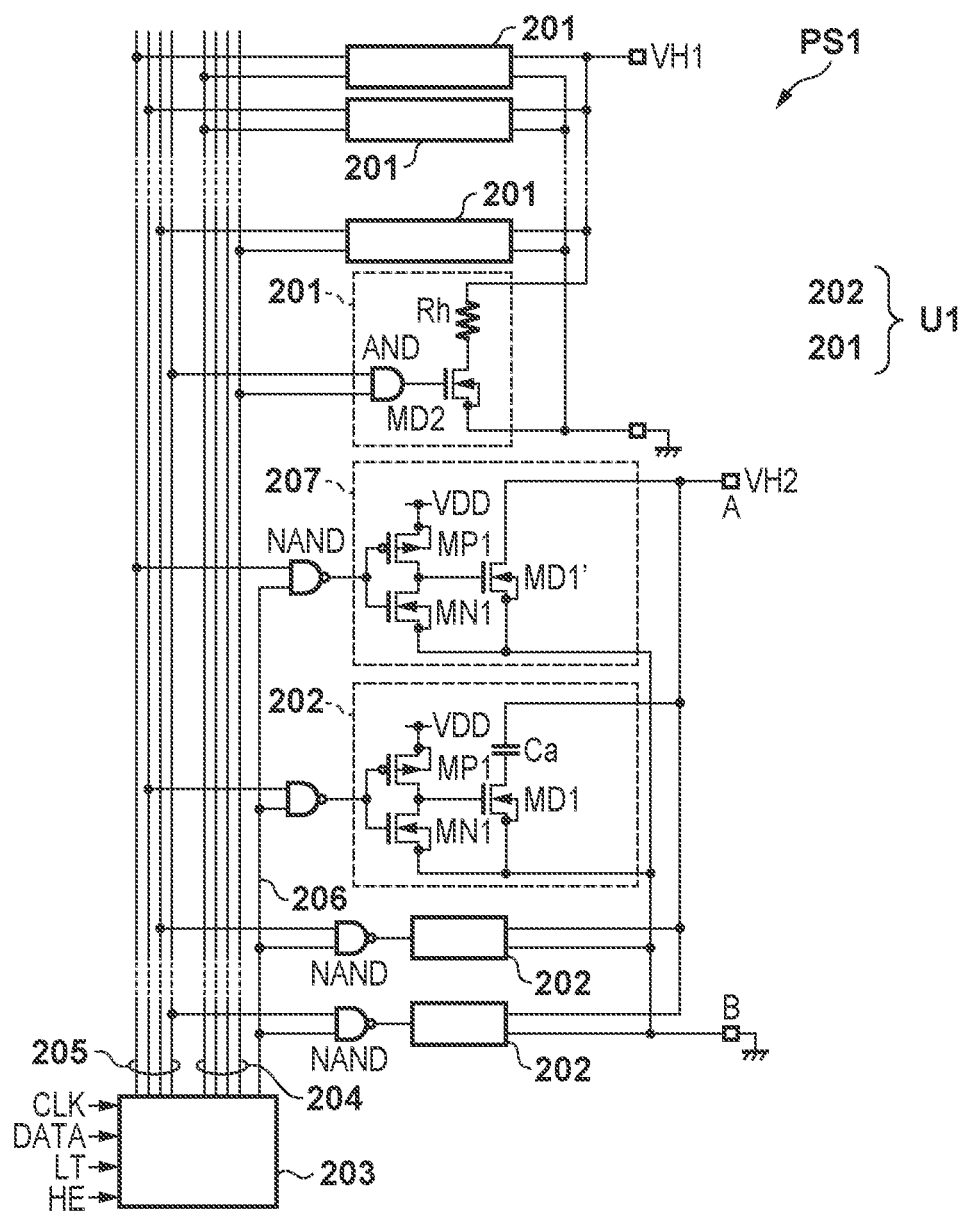
FIG. 1 is a circuit diagram for explaining an example of the configuration of a print element substrate.

Hereinafter, exemplary embodiments will be described in detail with reference to the accompanying drawings. It should be noted that the following embodiments are not intended to limit the scope of the appended claims. A plurality of features are described in the embodiments. However, not all the plurality of features are necessarily essential to the aspect of the embodiments, and the plurality of features may arbitrarily be combined. In addition, the same reference numerals denote the same or similar parts, and a repetitive description will be omitted.

(Example of Configuration of Printing Apparatus)

Figure 5A:
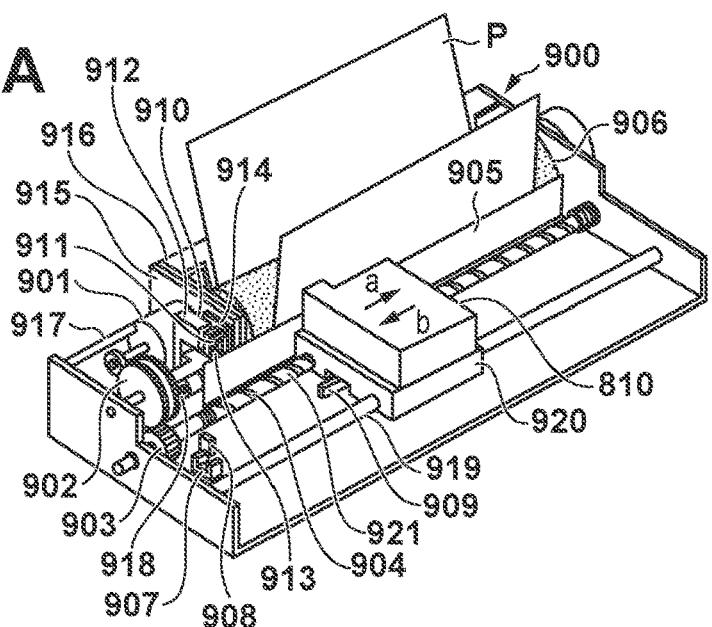
FIGS. 5A to 5D are views for explaining an example of the configuration of a printing apparatus.

FIG. 5A shows the internal configuration of a printing apparatus 900 that performs printing using an inkjet method. The printing apparatus 900 includes a printhead 810 that discharges a printing material (in this example, ink) to a predetermined print medium P (in this example, a sheet-shaped member such as paper). The printhead 810 is mounted on a carriage 920, and the carriage 920 can be attached to a lead screw 921 with a helical groove 904. The lead screw 921 can rotate interlocking with the rotation of a drive motor 901 via driving force transmission gears 902 and 903. Accordingly, the printhead 810 can move along a guide 919 in the direction of an arrow a or b together with the carriage 920.

The print medium P is pressed by a paper pressing plate 905 along the carriage moving direction and fixed to a platen 906. The printing apparatus 900 reciprocally moves the printhead 810 and performs printing on the print medium P conveyed onto the platen 906 by a conveyance unit (not shown).

In addition, the printing apparatus 900 confirms, via photocouplers 907 and 908, the position of a lever 909 provided on the carriage 920, and switches the rotation direction of the drive motor 901. A support member 910 supports a cap member 911 configured to cover the nozzles (liquid discharge ports or, simply, discharge ports) of the printhead 810. A suction means 912 performs recovery processing of the printhead 810 by sucking the interior of the cap member 911 via an intra-cap opening 913. A lever 917 is provided to start the recovery processing by suction. The lever 917 moves along with the movement of a cam 918 that engages with the carriage 920, and the driving force from the drive motor 901 is controlled by a known transmission means such as clutch switching.

Also, a main body support plate 916 supports a moving member 915 and a cleaning blade 914. The moving member 915 moves the cleaning blade 914 to perform recovery processing of the printhead 810 by wiping. In addition, a control unit (not shown) is provided in the printing apparatus 900. The control unit controls driving of each mechanism described above.

Figure 5B:
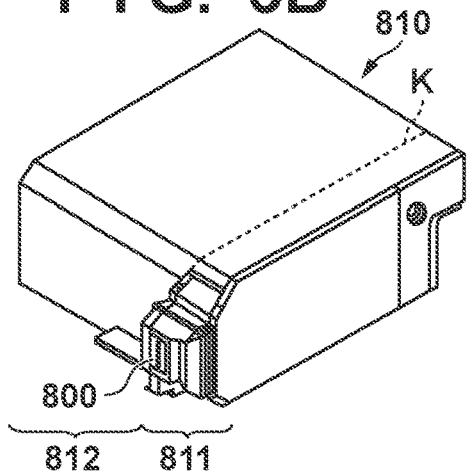

FIG. 5B shows the outer appearance of the printhead 810. The printhead 810 can include a head portion 811 including a plurality of nozzles 800, and a tank (liquid storage portion) 812 that holds a liquid to be supplied to the head portion 811. The tank 812 and the head portion 811 can be separated at, for example, broken line K, and the tank 812 can be exchanged. The printhead 810 includes an electrical contact (not shown) configured to receive an electrical signal from the carriage 920, and discharges the liquid in accordance with the electrical signal. The tank 812 includes, for example, a fibrous or porous liquid holding material (not shown), and the liquid can be held by the liquid holding material.

Figure 5C:
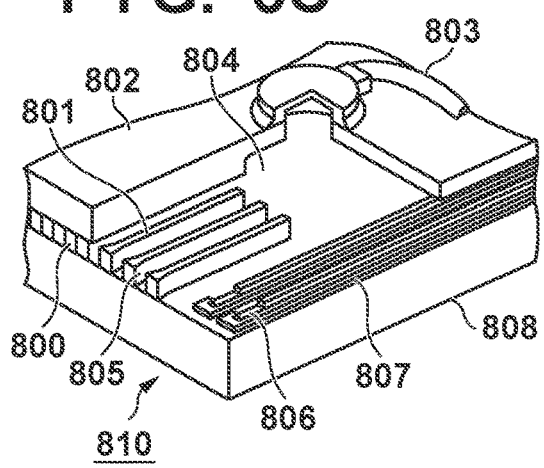

FIG. 5C shows the internal configuration of the printhead 810. The printhead 810 includes a base 808, channel wall members 801 arranged on the base 808 to form channels 805, and a top panel 802 including a liquid supply path 803. In addition, heaters (electrothermal transducers) 806 serving as print elements are arrayed on the substrate (print element substrate) included in the printhead 810 in correspondence with the nozzles 800. Each heater 806 is driven and generates heat when a driving element (a switch element such as a transistor) provided in correspondence with the heater 806 is set in a conductive state.

The liquid from the liquid supply path 803 is stored in a common liquid chamber 804 and supplied to the nozzles 800 via the channels 805. The liquid supplied to each nozzle 800 is discharged from the nozzle 800 in response to driving of the heater 806 corresponding to the nozzle 800.

Figure 5D:
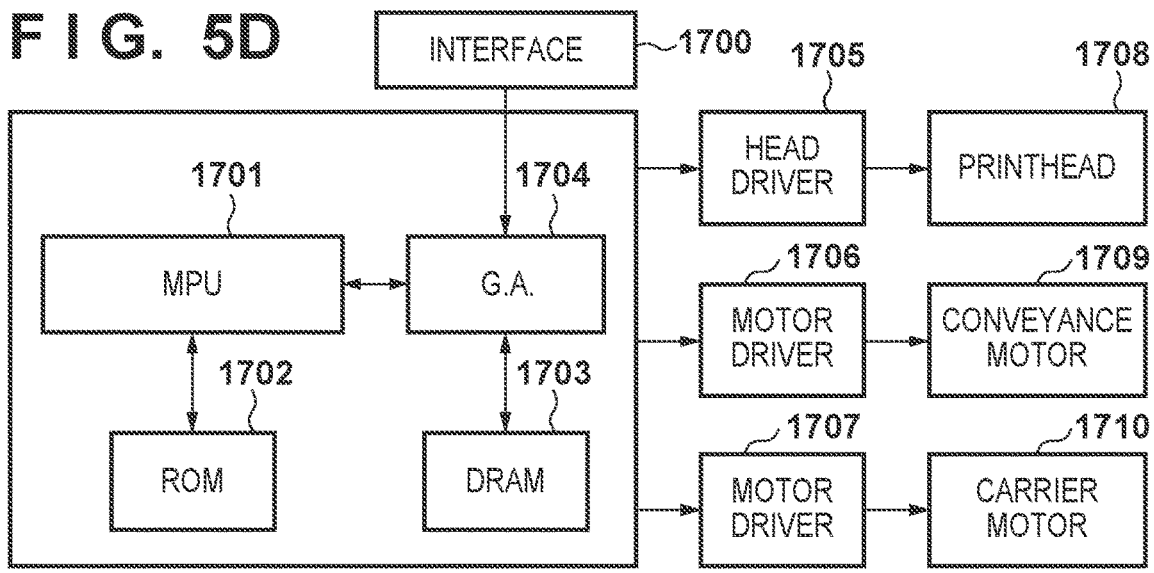

FIG. 5D shows the system configuration of the printing apparatus 900. The printing apparatus 900 includes an interface 1700, an MPU 1701, a ROM 1702, a RAM 1703, and a gate array 1704. An external signal for executing printing is input from the outside to the interface 1700. The ROM 1702 stores a control program to be executed by the MPU 1701. The RAM 1703 saves various kinds of signals and data such as an external signal for printing and data supplied to a printhead 1708. The gate array 1704 controls supply of data to the printhead 1708 and also controls data transfer between the interface 1700, the MPU 1701, and the RAM 1703.

The printing apparatus 900 further includes a head driver 1705, motor drivers 1706 and 1707, a conveyance motor 1709, and a carrier motor 1710. The carrier motor 1710 conveys the printhead 1708. The conveyance motor 1709 conveys the print medium P. The head driver 1705 drives the printhead 1708. The motor drivers 1706 and 1707 drive the conveyance motor 1709 and the carrier motor 1710, respectively.

When a drive signal is input to the interface 1700, the drive signal can be converted into print data between the gate array 1704 and the MPU 1701. Each mechanism performs a desired operation in accordance with the data, and the printhead 1708 is thus driven.

In summary, the printing apparatus 900 includes the printhead 810 (or 1708), and the driver 1705 configured to drive it. The printhead 810 includes the print element substrate, and the plurality of nozzles 800 corresponding to the plurality of print elements 806 arrayed on the print element substrate. A detailed configuration of the print element substrate will be described in the following embodiments. The contents are not limited to the print element substrate and can be applied to a variety or semiconductor devices.

First Embodiment

FIG. 1 shows an example of the configuration of a print element substrate PS1 according to the first embodiment. The print element substrate PS1 includes a plurality of print elements 201 arrayed in a predetermined direction, a plurality of units U1 arrayed in the same direction, and a controller 203. The print element substrate PS1 typically has a rectangular shape, and the plurality of print elements 201 and in one embodiment, the plurality of units U1 are arrayed, for example, along a side direction of the print element substrate PS1 in a top view (planar view).

Each print element 201 includes a print element Rh, a driving element MD2 configured to drive it, and a logic circuit (here, an AND circuit) configured to control the driving element MD2. As the print element Rh, an element capable of executing the above-described printing is used. In this embodiment, a heater (electrothermal transducer) is used. As another embodiment, a piezoelectric element may be used. As the driving element MD2, a high breakdown voltage transistor is used. In this embodiment, a DMOS (Double-Diffused Metal Oxide Semiconductor) transistor is used. The print element Rh and the driving element MD2 are connected in series, and a voltage VH1 (for example, 24 [V (volt)]) is applied to these.

Here, the controller 203 can drive the plurality of print elements Rh by a time division method. That is, the plurality of print elements Rh are divided into a plurality of groups, and the controller 203 sequentially drives each of two or more print elements Rh of each group as a block. For example, if the number of groups is i, and each group includes j print elements Rh as blocks, first, the controller 203 drives a first block (i print elements Rh) for each of the first to ith groups. Next, the controller 203 drives a second block (i print elements Rh) for each of the first to ith groups. According to the same procedure, the controller 203 sequentially drives a third, fourth, . . . , jth blocks (i print elements Rh in each block) for each of the first to ith groups.

To implement driving of the plurality of print elements Rh by the time division method, the controller 203 can typically include a decoder, a shift register, a latch circuit, a selector, an AND circuit, an OR circuit, and the like. Based on print data, a clock signal CLK, a latch signal LT, and a heat enable signal HE, the controller 203 time-divisionally drives the corresponding print elements Rh via a group selection signal 204 and a block selection signal 205, although a description of details will be omitted.

Note that each of i and j is an integer of 2 or more. Also, the group can also be called a time division group, and the block can also be called a time division block.

The plurality of units U1 include a memory unit (first unit) 202 and an evaluation unit (second unit) 207. The unit U1 may be expressed as, for example, a functional unit or the like. In this embodiment, a plurality of memory units 202 are arrayed, and one evaluation unit 207 is provided to be juxtaposed to these.

The print element substrate PS1 further includes a terminal (first terminal) A and a terminal (second terminal) B configured to supply voltages to the plurality of units U1. The terminal A is provided as a terminal configured to supply a voltage VH2 (for example, 32 [V]) capable of implement write to a memory element Ca to be described later, and the terminal B is provided as a ground terminal.

Figure 3A:
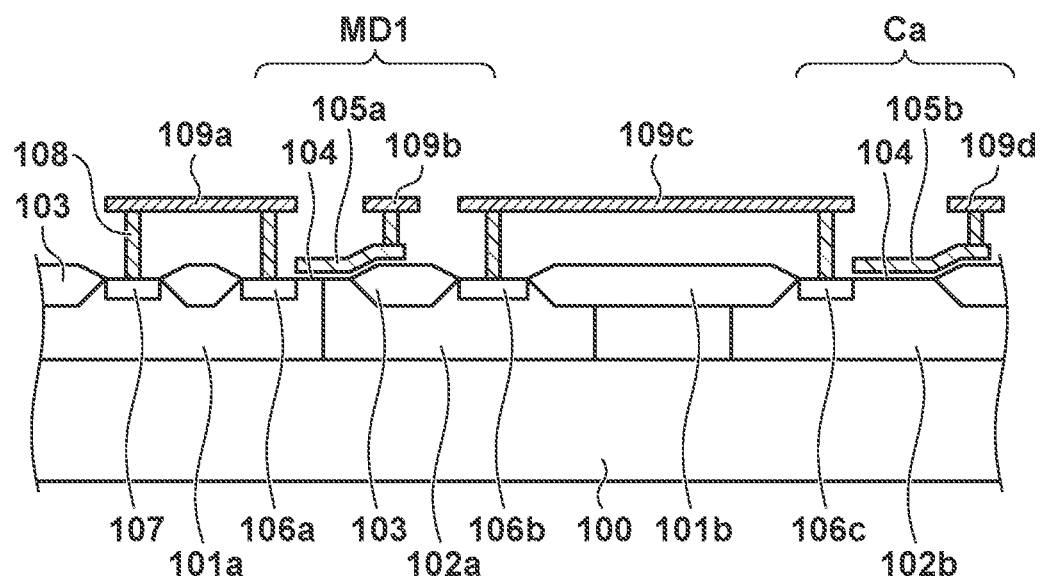
FIGS. 3A and 3B are sectional views for explaining an example of the sectional structure of the print element substrate.

FIG. 2A shows an example of the circuit configuration of the memory unit 202, and FIG. 3A shows an example of the structure of the memory unit 202.

The memory unit 202 includes the memory element Ca, and a write/read transistor (first transistor) MD1 configured to perform write to the memory element Ca and/or read from the memory element Ca. A MOS (Metal Oxide Semiconductor) structure is used in the memory element Ca, and the memory element Ca functions as an anti-fuse element capable of performing write by dielectric breakdown of the MOS structure. As the transistor MD1, a high breakdown voltage transistor is used. In this embodiment, a DMOS transistor is used.

The memory element Ca and the transistor MD1 are arranged between the terminals A and B and connected in series. The transistor MD1 is set in a conductive state while supplying the voltage VH2 to the terminal A, thereby causing dielectric breakdown of the MOS structure of the memory element Ca and thus performing write to the memory element Ca.

The memory unit 202 can be formed on, for example, a semiconductor substrate such as a silicon substrate using a known semiconductor process. In this embodiment, p-type wells 101*a* and 101*b* and n-type wells 102*a* and 102*b* are provided on a p-type region 100. An n-type region 106*a* and a p-type region 107 are provided in the p-type well 101*a*. An n-type region 106b is provided in the n-type well 102a. An n-type region 106c is provided in the n-type well 102b. Relatively thick insulating members 103 are provided between the regions 106a to 106c and 107. The insulating members 103 are formed by LOCOS (LOCal Oxidation of Silicon). Also, gate electrodes 105a and 105b made of polysilicon or the like are provided to cover relatively thin gate insulating films between the insulating members 103 and also partially cover the insulating members 103.

The transistor MD1 and the memory element Ca are connected to wiring portions 109a to 109d via contact plugs 108. The transistor MD1 is connected to the terminal B via the wiring portion 109a in the source and the back gate, connected to the wiring portion 109b in the gate, and connected to the wiring portion 109c in the drain. Also, the anti-fuse element serving as the memory element Ca is connected to the wiring portion 109c in one terminal, and connected to the terminal A via the wiring portion 109d in the other terminal.

Figure 3B:
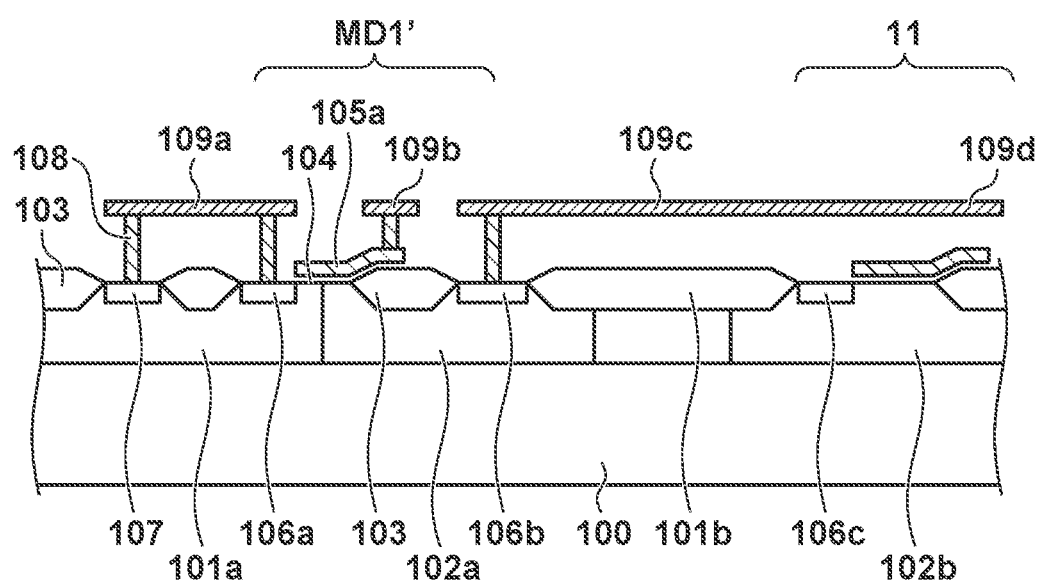

FIG. 2B shows an example of the circuit configuration of the evaluation unit 207, and FIG. 3B shows an example of the structure of the evaluation unit 207.

The evaluation unit 207 includes a transistor (second transistor) MD1', and a MOS structure 11 corresponding to the memory element Ca. The transistor MD1' is arranged between the terminals A and B in correspondence with the transistor MD1 of the memory unit 202.

In addition, the evaluation unit 207 further includes a p-channel MOS transistor MP1 and an n-channel MOS transistor MN1. These are connected in series to form an inverter INV1. A logic circuit (here, a NAND circuit) is arranged at the preceding stage of the inverter INV1. With this configuration, a control signal Sig is input to the inverter INV1.

As is apparent from comparison between FIGS. 3A and 3B, the evaluation unit 207 is different from the memory unit 202 in the connection mode of the wiring portions 109c and 109d. That is, the transistor MD1' and the MOS structure 11 are juxtaposed, like the transistor MD1 and the memory element Ca. On the other hand, the connection mode of the wiring portions 109c and 109d is different from that in the transistor MD1 and the memory element Ca. More specifically, the terminals A and B are connected to the transistor MD1' via the wiring portions 109a, 109c, and 109d, and the wiring portions 109a, 109c, and 109d are not connected to the MOS structure 11.

In this way, the transistor MD1' is electrically isolated from the MOS structure 11 and, in this embodiment, set in a floating state. In the viewpoint of the function (to be described later) of the evaluation unit 207, the MOS structure 11 may be omitted. However, in one embodiment, the MOS structure 11 is formed for the purpose of reducing the manufacturing variation of the memory element Ca arrayed together.

The controller 203 is also configured to execute write to the memory element Ca. In this embodiment, the controller 203 can perform write to the plurality of memory elements Ca by the time division method, and can perform write to the corresponding memory element Ca via the block selection signal 205 and a control signal 206.

To prevent a write error to the memory element Ca, a resistive element (not shown) may be connected in parallel with the memory element Ca. As the resistive element, a resistive element capable of forming an electric resistance of, for example, in one embodiment, several tens of [kΩ (kiloohm)] is used. This resistive element may be made of polysilicon or a diffusion resistor.

With the above-described configuration, the controller 203 can drive the plurality of print elements Rh by the time division method, and can also perform write to the plurality of memory elements Ca by the time division method as needed. Write to the memory element Ca may be performed to, for example, store specific information at the time of manufacturing of the print element substrate PS1, or may be performed as needed (for example, to save a use history) when using the print element substrate PS1.

Here, place focus on the plurality of units U1, in this embodiment, the plurality of memory units 202 and one evaluation unit 207 (see FIG. 1). The plurality of units U1 are used by setting one of the above-described transistors MD1 and MD1' in the conductive state.

For example, if one of the plurality of memory units 202 is selected to perform write to the memory element Ca, the corresponding transistor MD1 is set in the conductive state in a state in which the voltage VH2 is applied across the terminals A and B. During this time, the remaining transistors MD1 are set in a non-conductive state, and the transistor MD1' is set in the non-conductive state. This implements write to the memory element Ca of the selected memory unit 202.

Also, to use the evaluation unit 207, the transistor MD1' is set in the conductive state in a state in which the voltage VH2 (or another voltage) is applied across the terminals A and B. During this time, all the plurality of transistors MD1 are set in the non-conductive state. When the electrical resistance between the terminals A and B is measured in this state, an electrical resistance parasitic to each of the plurality of memory units 202 can equivalently be evaluated, and the evaluation result can be used for, for example, the write characteristic or read characteristic. Since this is effective when the number of units U1 is large, it can be said that it is particularly beneficial in increasing the capacity of the memory.

Second Embodiment

As the second embodiment, the above-described evaluation unit 207 can be made to function as an electrostatic discharge (ESD) protection element.

Figure 4B:
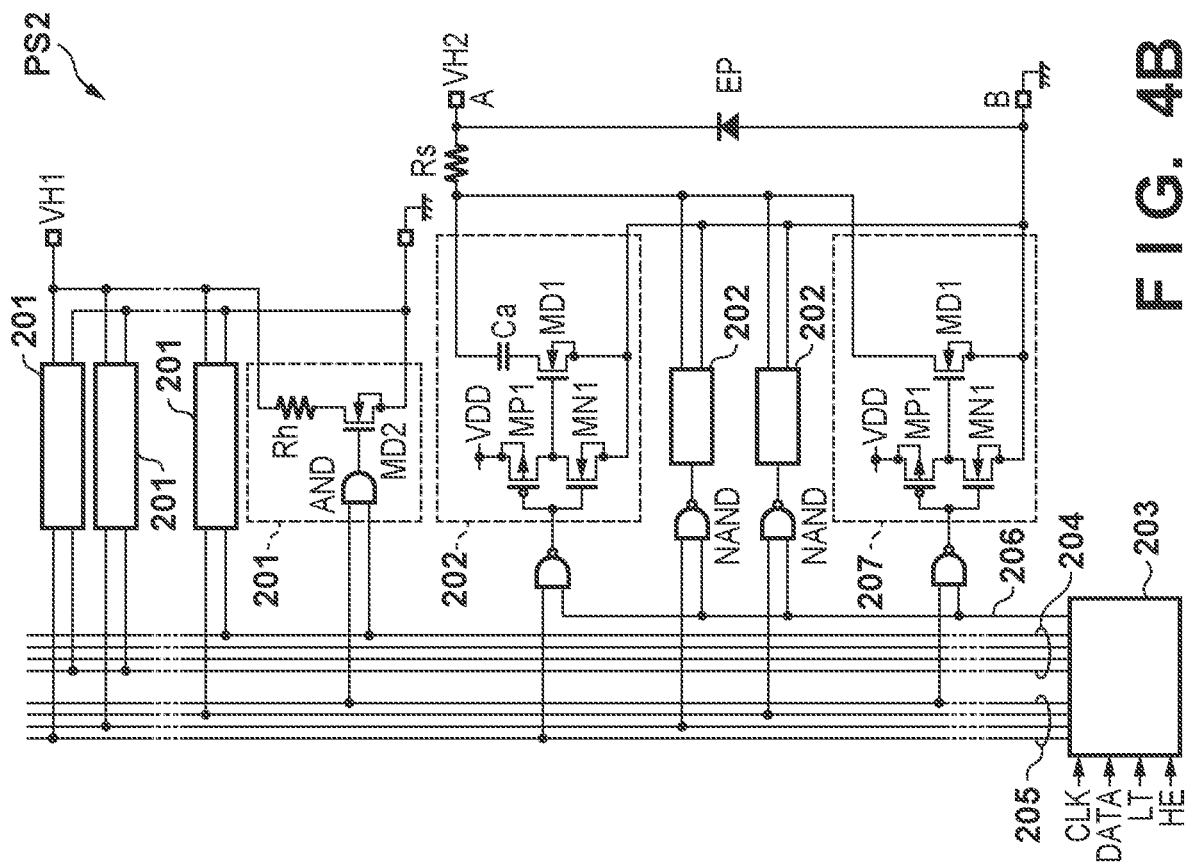
FIGS. 4A and 4B are circuit diagrams for explaining other examples of the configuration of the print element substrate.
Figure 4A:
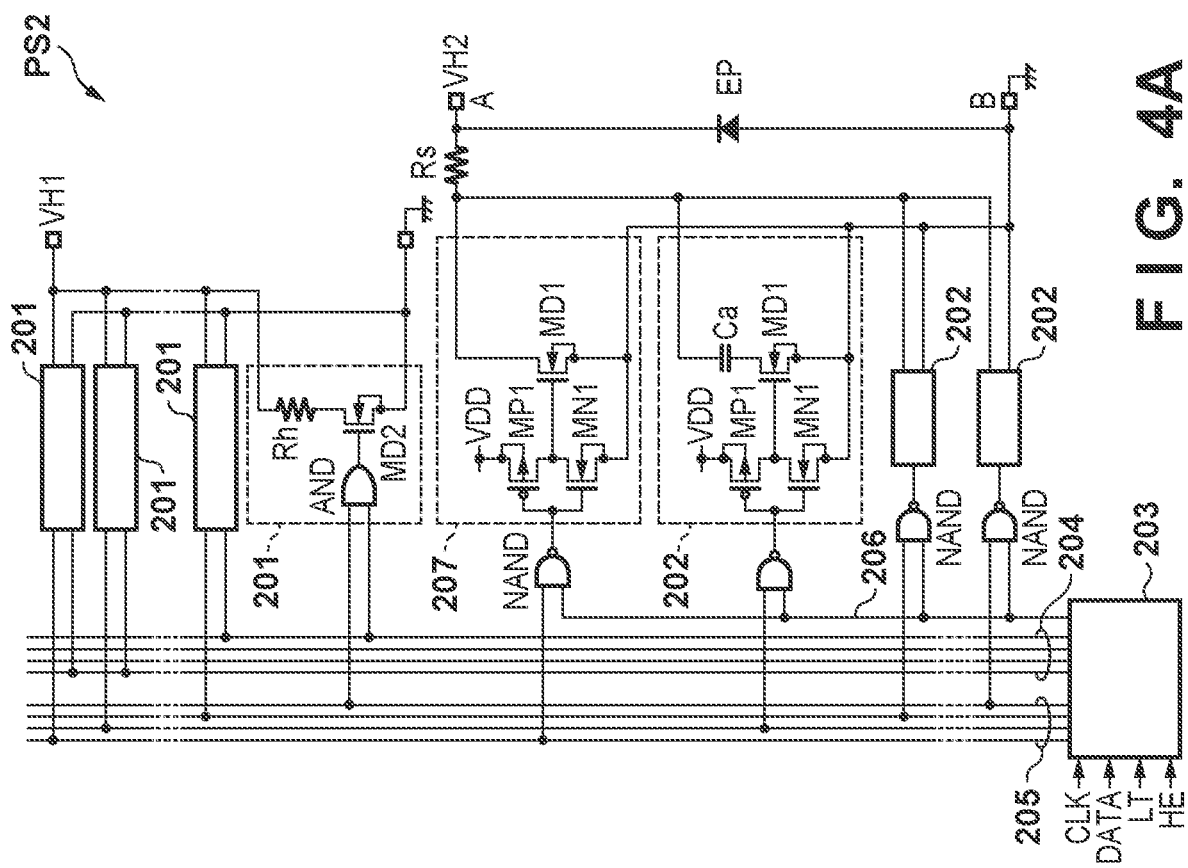

FIG. 4A shows an example of the configuration of a print element substrate PS2 according to this embodiment. In addition to the same configuration as the print element substrate PS1, the print element substrate PS2 further includes a rectifying element EP1 functioning as an ESD protection element. The rectifying element EP1 is connected to a terminal A in the anode, and connected to a terminal B in the cathode. The rectifying element EP1 can protect the circuit configuration in the print element substrate PS2 from ESD (Electro-Static Discharge) generated between the terminals A and B.

For example, if a surge current caused by ESD is applied in the path from the terminal B to the terminal A, the surge current flows from the terminal B to the terminal A via the rectifying element EP1. Note that examples of the type of ESD are an HBM (Human Body Model, electro-static discharge from a human body) and an MM (Machine Model, electro-static discharge from a manipulator or the like during manufacturing). The surge current caused by ESD generally flows in a relatively short time, for example, several tens of [nsec (nanoseconds)] to several tens of [μsec (microseconds)].

The print element substrate PS2 further includes a resistive element Rs serving as another ESD protection element. The resistive element Rs is arranged between the terminal A and a plurality of units U1, and can protect the circuit configuration in the print element substrate PS2 from ESD applied to the terminal A. As the resistive element Rs, a resistive element of, for example, about 2 to 7 [Ω], and in one embodiment, about 5 [Ω] is used. The resistive element Rs can typically be made of polysilicon.

Together with the resistive element Rs, a transistor MD1' of an evaluation unit 207 functions as another ESD protection element. The transistor MD1' is normally in a non-conductive state. However, when a surge current caused by ESD is applied, the surge current can be flowed by breakdown between the drain and the source. It can therefore be said that the transistor MD1' functions as a protection transistor for ESD protection, which is also called a GGMOS (Gate-Grounded MOS).

Hence, for example, if the surge current caused by ESD is applied in the path from the terminal A to the terminal B, the surge current flows from the terminal A to the terminal B via the resistive element Rs and the transistor MD1' of the evaluation unit 207.

According to the above-described configuration, if a relatively high voltage caused by ESD is applied across the terminal A and B, the plurality of memory units 202 can be protected.

Also in the example shown in FIG. 4A, the plurality of units U1 are arrayed such that, of the memory units 202 and the evaluation unit 207, the evaluation unit 207 has the shortest path to the resistive element Rs. Hence, if the surge current caused by ESD is applied in the path from the terminal A to the terminal B, the transistor MD1' of the evaluation unit 207 functions as a protection transistor at a relatively early timing. For this reason, the transistor MD1' can appropriately protect the plurality of memory units 202.

FIG. 4B shows, as a modification of this embodiment, a mode in which, of the memory units 202 and the evaluation unit 207, the evaluation unit 207 is arranged to have the longest path to the resistive element Rs. According to the example shown in FIG. 4B, if the surge current caused by ESD is applied in the path from the terminal A to the terminal B, a wiring resistance component until reaching the evaluation unit 207 contributes to ESD protection, in addition to the resistive element Rs and the transistor MD1'. For this reason, the resistance of the transistor MD1' to the surge current can be improved.

As described above in the first embodiment, to prevent a write error to a memory element Ca, a resistive element (not shown) may be connected in parallel with the memory element Ca (to be referred to as a "parallel resistor" hereinafter). In this configuration as well, when measuring the electrical resistance between the terminals A and B using the evaluation unit 207, it is demanded to appropriately evaluate the electrical resistance parasitic to each of the plurality of memory units 202. It is also demanded to make the resistance value of the resistive element Rs small and prevent read from the memory element Ca from resulting in an unintended result. For this purpose, in one embodiment, the resistance value of the above-described parallel resistor is larger than the resistance value of the resistive element Rs, and the resistance value in the conductive state of the transistor MD1' is smaller than the resistance value of the resistive element Rs.

As described above, according to this embodiment, it is beneficial in the viewpoint of protecting the print element substrate PS2 from ESD, in addition to the effect of the first embodiment.

OTHERS

In the above description, the printing apparatus 900 using the inkjet method has been described as an example. However, the printing method is not limited to this. Also, the printing apparatus 900 may be a single function printer having only a printing function or may be a multi-function printer having a plurality of functions such as a printing function, a FAX function, and a scanner function. In addition, the printing apparatus 900 may be a manufacturing apparatus configured to manufacture, for example, a color filter, an electronic device, an optical device, a microstructure, or the like using a predetermined printing method.

Also, "print" in this specification should be interpreted in a broader sense. Hence, the mode of "print" is irrespective of whether or not the target to be formed on a print medium is significant information such as a character or graphic pattern, and is also irrespective of whether the target is manifested in a way that can be perceived visually by humans.

"Print media" should also be interpreted in a broader sense, like "print". Hence, the concept of "print media" can include not only paper used in general but also any materials capable of receiving ink, including fabrics, plastic films, metals, glass, ceramics, resins, wood, and leathers.

"Ink" should also be interpreted in a broader sense, like "print". Hence, the concept of "ink" can include not only a liquid that is applied to a print medium to form an image, a design, a pattern, or the like but also an incidental liquid that can be provided to process a print medium or process ink (for example, coagulate or insolubilize color materials in ink applied to a print medium). From these viewpoints, the printing apparatus 900 can also be expressed as the liquid discharge apparatus 900, the printhead 810 can also be expressed as the liquid discharge head 810, and the print element Rh can also be expressed as a liquid discharge element.

The disclosure is not limited to the above-described embodiments, and various changes and modifications can be made within the spirit and scope of the disclosure. Therefore, to apprise the public of the scope of the disclosure, the following claims are made.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-039535, filed on Mar. 11, 2021, which is hereby incorporated by reference herein in its entirety.

What is claimed is:

1. A device comprising:
    a plurality of units arrayed in a predetermined direction;
    a first terminal configured to supply a voltage to the plurality of units; and
    a second terminal configured to supply a voltage to the plurality of units,
    wherein the plurality of units include:
    a first unit including a memory element arranged between the first terminal and the second terminal, and a first transistor configured to perform write to the memory element, wherein the first transistor can be controlled to change between a conductive state and a non-conductive state by a voltage on a first signal line; and
    a second unit including a second transistor arranged between the first terminal and the second terminal in correspondence with the first transistor of the first unit, wherein the second transistor can be controlled to change between a conductive state and a non-conductive state by a voltage on a second signal line, wherein the voltage on the first signal line can be controlled independently of the voltage on the second signal line, a voltage on the first terminal, and a voltage on the second terminal, and wherein the voltage on the second signal line can be controlled independently of the voltage on the first signal line, the voltage on the first terminal, and the voltage on the second terminal.

2. The device according to claim 1, further comprising a resistive element configured to protect the plurality of units from electrostatic discharge (ESD).

3. The device according to claim 2, wherein the plurality of units are arrayed such that, of the first unit and the second unit, the second unit has a shortest path to the resistive element.

4. The device according to claim 2, wherein the plurality of units are arrayed such that, of the first unit and the second unit, the second unit has a longest path to the resistive element.

5. The device according to claim 2, further comprising a rectifying element connected between the first terminal and the second terminal.

6. The device according to claim 2, wherein between the first terminal and the second terminal, the second transistor functions as a protection transistor configured to protect the first unit from ESD.

7. The device according to claim 1, wherein
the second unit further includes a Metal Oxide Silicon (MOS) structure corresponding to the memory element of the first unit, and
the first terminal and the second terminal are connected to the second transistor via a wiring portion, and the wiring portion is not connected to the MOS structure.

8. The device according to claim 1, further comprising a controller configured to perform write to the memory element by controlling the voltage on the first signal line,
wherein the first unit is one of a plurality of first units, and
the controller performs write to a plurality of memory elements corresponding to the plurality of first units by a time division method.

9. The device according to claim 1, wherein
the device is a print element substrate, and further comprises:
a plurality of print elements arrayed in the predetermined direction; and
a plurality of driving elements configured to drive the plurality of print elements.

10. A liquid discharge head comprising:
the device defined in claim 9; and
a plurality of liquid discharge ports corresponding to a plurality of print elements of the device.

11. The liquid discharge head according to claim 10, wherein the device further comprises a resistive element configured to protect the plurality of units from electrostatic discharge (ESD).

12. The liquid discharge head according to claim 11, wherein, in the device, the plurality of units are arrayed such that, of the first unit and the second unit, the second unit has a shortest path to the resistive element.

13. The liquid discharge head according to claim 11, wherein, in the device, the plurality of units are arrayed such that, of the first unit and the second unit, the second unit has a longest path to the resistive element.

14. The liquid discharge head according to claim 10, wherein
the second unit further includes a Metal Oxide Silicon (MOS) structure corresponding to the memory element of the first unit, and
the first terminal and the second terminal are connected to the second transistor via a wiring portion, and the wiring portion is not connected to the MOS structure.

15. The liquid discharge head according to claim 10, wherein the device further comprises a controller configured to perform write to the memory element by controlling the voltage on the first signal line,
wherein the first unit is one of a plurality of first units, and
the controller performs write to a plurality of memory elements corresponding to the plurality of first units by a time division method.

16. The liquid discharge head according to claim 10, wherein
the device is a print element substrate, and further comprises:
a plurality of print elements arrayed in the predetermined direction; and
a plurality of driving elements configured to drive the plurality of print elements.

17. A liquid discharge apparatus comprising:
the liquid discharge head defined in claim 10; and
a driver configured to drive the liquid discharge head.

18. The device according to claim 1,
wherein the first unit further includes a first inverter, wherein the first inverter controls the voltage on the first signal line, and
wherein the second unit further includes a second inverter, wherein the second inverter controls the voltage on the second signal line.

19. The device according to claim 18,
wherein the first inverter is controllable via a third signal line and a fourth signal line, and
wherein the second inverter is controllable via the third signal line and a fifth signal line.

20. The device according to claim 18,
wherein a structure of the first inverter is identical to a structure of the second inverter.

* * * * *